United States Patent [19]

Kondo et al.

[11] Patent Number: 5,122,930
[45] Date of Patent: Jun. 16, 1992

[54] HIGH HEAT-CONDUCTIVE, THICK FILM MULTI-LAYERED CIRCUIT BOARD

[75] Inventors: Kazuo Kondo, Nagoya; Asao Morikawa, Komaki, both of Japan

[73] Assignee: NGK Spark Plug Co., Ltd., Nagoya, Japan

[21] Appl. No.: 456,087

[22] Filed: Jan. 4, 1990

Related U.S. Application Data

[63] Continuation of Ser. No. 146,636, Jan. 21, 1988, abandoned.

Foreign Application Priority Data

Jan. 22, 1987 [JP] Japan .................. 62-11287

[51] Int. Cl.⁵ ........................... H05K 1/11
[52] U.S. Cl. .................... 361/414; 361/386
[58] Field of Search ............... 361/386–388, 361/402, 414; 174/68.5

[56] References Cited

U.S. PATENT DOCUMENTS

| | | | |
|---|---|---|---|
| 3,187,226 | 6/1965 | Kates | 361/387 |
| 3,293,501 | 12/1966 | Martin | 174/68.5 X |
| 3,585,272 | 6/1971 | Shatz | 174/16 HS X |
| 4,115,837 | 9/1978 | Beall et al. | 361/388 |
| 4,130,855 | 12/1978 | Smolko et al. | 361/387 |
| 4,188,652 | 2/1980 | Smolko | 361/402 |
| 4,301,324 | 11/1981 | Kumar et al. | 174/68/5 |
| 4,322,778 | 3/1982 | Barbour et al. | 174/68.5 X |
| 4,490,429 | 12/1984 | Tosaki et al. | 174/68.5 X |
| 4,591,537 | 5/1986 | Aldinger et al. | 361/387 X |
| 4,650,923 | 3/1987 | Nishigaki et al. | 174/68.5 |
| 4,672,152 | 6/1987 | Shinohara et al. | 174/68.5 |
| 4,698,663 | 10/1987 | Sugimoto | 174/16 HS X |
| 4,731,701 | 3/1988 | Kuo et al. | 361/388 |
| 4,788,627 | 11/1988 | Ehlert et al. | 361/386 X |

*Primary Examiner*—Gregory D. Thompson
*Attorney, Agent, or Firm*—Fish and Richardson

[57] ABSTRACT

High heat-conductive, thick film multilayered circuit board for high speed signal transmission in a high frequency region, the circuit board comprising: a substrate having high heat conductivity; an oxidized layer formed on a surface of said substrate; an electrically conductive layer formed of a printed paste containing therein crystallized glass; and an insulating layer formed of a printed insulating paste comprised of crystallized glass as a principal constituent, wherein at least one of said conductive layer and at least one of said insulating layer are alternately disposed by printing on the oxidized layer of said substrate, and said conductive and insulating layers have been heated to form solid layers. The substrate is AlN, SiC/BeO, SiC, Cu/W and/or $ZrB_2$ having a heat conductively of 40–140 W/m·k at room temperature. The layers have high adhesion strength to the substrate and the insulating layer has a low dielectric constant.

39 Claims, 1 Drawing Sheet

HIGH HEAT-CONDUCTIVE, THICK FILM MULTI-LAYERED CIRCUIT BOARD

This application is a continuation of U.S. application Ser. No. 146,636, filed Jan. 21, 1988, now abandoned.

BACKGROUND

This invention relates to an improvement in a high heat-conductive circuit board which can be suitably used for high speed signal propagation, and so on in a high frequency region, particularly for multilayer circuits.

With development and progress in miniaturization, etc. of electronic equipments in recent years, packaging density of those electrical elements such as integrated circuits (IC), etc. on the circuit board has become increased. Further, considering that power semiconductors, etc. are to be mounted on such circuit board, amount of heat generated on such board has (and will) become much greater.

On the other hand, looking into the materials for the substrate of the circuit boards, it is found that the ceramic substrate is more heat-resistant than the resin substrate. Of those various ceramic substrates, the $Al_2O_3$ substrate is cheap in price, and is excellent in its mechanical strength and electrical insulation, besides which it can be readily prepared into green sheets. On account of such advantages it possesses, $Al_2O_3$ has been widely used for fabrication of high density circuit board such as multi-layered interconnection, and so forth. However, since this material has its heat-conductivity as low as 20 W/m·k or so, development of other appropriate material has been longed for.

In answer to this desire, there have been developed various materials such as SiC, AlN, and others which are excellent in their mechanical strength. Since these materials are also excellent in the heat-conductivity, there were attempts to use them as the circuit substrate. However, SiC is inadequate to be used as the substrate, on which those electrical elements to be applied with high electric voltage are mounted, because of its high dielectric constant and low dielectric strength. As an alternative, AlN has drawn attention as the material for the circuit substrate, and one embodiment construction is proposed in, for example, Japanese Patent Kokai Publication No. 61-119094. According to this Kokai Publication, it is disclosed that formation of an oxidized layer on the surface of the AlN substrate enables metallized conductors (made of thick film paste) thereon by heating. As the methods for forming such oxidized layer, there are proposed three manners: (1) treating the AlN substrate in an atmosphere at a temperature of 1,250° C. for one hour; (2) treating it by immersion in phosphoric acid liquid; and (3) leaving it in water vapor at a temperature of 121° C. and under a pressure of 2 atm. for 168 hours.

The above-described conventional technique has drawbacks that the substrate material is limited to AlN; an ordinary vitreous (or glassy) material is used for the resistor paste and a lead frame is used for the circuit conductor, wherein, however, printing of Ag-Pd paste is directly applied on to the substrate, hence microcracks or cracks, etc. tend to occur readily entailing difficulties in constructing the multilayered circuit board; and further, formation of the oxidized layer is limited to the abovementioned three manners.

SUMMARY OF THE DISCLOSURE

It is a primary object of the present invention to solve the abovementioned points of problem. Thus it is an object of the present invention to provide an improved circuit board having high heat-conductivity.

It is another object of the present invention to provide a multilayer circuit board having a high bonding strength between a substrate, conductor layers and insulating layers, for high mechanical strength.

It is a further object of the present invention to provide an improved circuit board which may be suitably employed for high speed signal propagation, etc. in the high frequency region, particularly, has high mechanical strength and electric insulation.

According to the present invention, in general aspect thereof, there is provided a high heat-conductive, thick film multilayered circuit board comprising:
- a substrate having high heat conductivity;
- an oxidized layer formed on a surface of said substrate;
- an electrically conductive layer formed of a printed paste containing therein crystallized glass; and
- an insulating layer formed of a printed insulating paste comprised of crystallized glass as a principal constitutent, wherein at least one of said conductive layer and at least one of said insulating layer are alternately disposed by printing on the oxidized layer of said substrate, and said conductive and insulating layers have been heated to form solid layers.

According to the present invention, use is made, as the high heat-conductive substrate material, of a ceramic substrate having much higher heat conductivity than alumina substrate (AlN has its heat conductivity which is approximately seven times as high as that of alumina), and yet this substrate material is not limited to AlN alone, but a wide variety of materials such as SiC, SiC/BeO, BeO, Cu/W, $ZrB_2$, and so forth may be used equally; onto such substrate, there are formed a multilayered structure by repeatedly printing the conductive paste and the insulating paste, both being prepared by using crystallized glass, through the intermediate (or underlying) oxidized layer formed on the surface of the substrate, followed by heating the printed pastes to form solid layers. Since the thermal expansion coefficient of both conductive and insulating layers is very close to that of the substrate material, there is no apprehension at all as to occurrence of cracks and peeling of the layers thus formed. Moreover, since the multilayered circuit board possesses low resistance and low dielectric constant, it can cope with the requirement for the high speed signal transmission. In addition, even when heat generation takes place from the substrate due to high density packaging of the electric elements such as integrated circuits, etc. on the substrate, such heat can be readily discharged from the radiating fins which can be disposed on the rear surface of the substrate. From what has been described in the preceding as to the effect to be derived from the present invention, it will be understood that the multilayered circuit board according to this invention provides high operational reliability which meets every requirement of the high density packaging of the integrated circuits, and high speed signal transmission.

The foregoing objects, other objects as well as specific compositions of the conductive paste and the insulating paste to form the multilayered circuit board according to the present invention will become more apparent and understandable from the following detailed description thereof with reference to one preferred embodiment thereof. when read in conjunction with the accompanying drawing.

BRIEF DESCRIPTION OF THE ACCOMPANYING DRAWING

In the drawing, the single FIG. 1 is a cross-sectional view showing one embodiment of the multilayered wiring substrate according to the present invention.

DETAILED DESCRIPTION OF PREFERRED EMBODIMENTS

Figure 1:
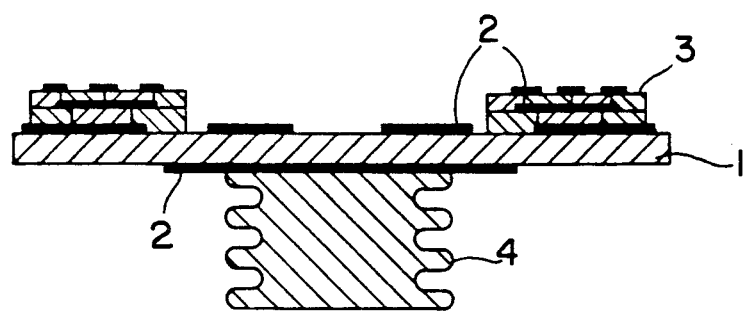

In the following, the present invention will be described in specific details with reference to a preferred embodiment thereof. The substrate according to the present invention has its heat conductivity of 40 W/m·k (at room temperature) or higher, or preferably 140 W/m·k or higher. For the materials having such high heat-conductivity, there may be exemplified AlN, SiC/BeO, SiC, Cu/W, $ZrB_2$, and so forth.

The oxidized layer (or portion of the substrate formed at its surface) embraces generally an oxide of the component elements of the substrate, e.g., alumina for AlN, $SiO_2$ for SiC or SiC/BeO, CuO for Cu/W or $ZrO_2$ for $ZrB_2$ or the like. The oxidized layer has a thickness preferably of 0.01 to 7 μm, more preferably up to 3 μm, most preferably about 0.1 μm. The oxidized layer may be formed by heat treating the substrate surface in certain atmosphere, e.g., for the AlN substrate in a wet reducing atmosphere, wherein the oxidizing heat treatment may be carried out at a temperature between 1,000° and 1,500° C., with a humidity of a dew point of −30° to +15° C., more preferably at 1,200° to 1,450° C. with a dew point of −15° to 0° C. Also, a heat treatment in the ambient air may be employed as disclosed in Japanese Patent Kokai Publication No. 61-119094.

The insulating layer is formed of, as a major constituent thereof, crystallized glass. The insulating layer is formed by consolidating the printed paste of the crystallized glass by heating it to a suitable temperature for consolidation. The crystallized glass is a glass containing fine crystallites precipitated from a glass matrix phase through heating. The thickness of the insulating layer is chosen so as to give sufficient insulation, e.g., about 10 μm or more, and may be up to about 250 μm (preferably about 30 μm) at the consolidated (sintered) state. However, generally speaking this layer thickness should be as thin as possible so far as insulation permits.

The insulating paste to be used in the present invention is crystallized glass. The crystallized glass contemplated in the present invention includes those which have a coefficient of thermal expansion $\alpha = 15$ to $45 \times 10^{-7}/°C$. (from room temperature to 400° C., preferably 25 to $45 \times 10^{-7}/°C$.) and can be made solid (consolidated) by heating at about 1,100° C. or less (preferably 900°-1,000° C.). Generally such crystallized glasses are grouped to $RO—Al_2O_3—SiO_2$ systems where RO represents ZnO, MgO, $Li_2O$, $Y_2O_3$, $ZrO_2$, CaO, BaO, $B_2O_3$, $P_2O_5$, etc. Such glasses are, for instance, of the systems $ZnO—MgO—Al_2O_3—SiO_2$, $CaO—B_2O_3—MgO—Al_2O_3—SiO_2$, $Y_2O_3—MgO—Al_2O_3—SiO_2$, $Li_2O—Al_2O_3—SiO_2$, $BaO—Al_2O_3—SiO_2$, etc.

Particularly desirable crystallized glasses are as follows: (1) the one as disclosed in Japanese Patent Kokai Publication No. 59-92943, which is comprised, as the principal components, of 57 to 63% by weight of $SiO_2$, 20 to 28% by weight of $Al_2O_3$, 10 to 18% by weight of MgO, and 2 to 6% by weight of ZnO, to which 0.1 to 6% by weight of $B_2O_3$ and/or $P_2O_5$ is added, the resultant mixture of the crystallized glass components being pulverized, fritted, and shaped, after which it is re-crystallized; (2) the one as disclosed in Japanese Patent Kokai Publication No. 59-83957, which is comprised of 40 to 52% by weight of $SiO_2$, 27 to 37 % by weight of $Al_2O_3$, 10 to 20% by weight of MgO, 2 to 8% by weight of $B_2O_3$, 2 to 8% by weight of CaO, and 0.1 to 3% by weight of $ZrO_2$, the resultant mixture of the crystallized glass components being pulverized, fritted, and shaped, after which it is re-crystallized; (3) the one as disclosed in Japanese Patent Kokai Publication No. 59-137341, which is comprised, as the principal components, of 55 to 63% by weight of $SiO_2$, 20 to 28% by weight of $Al_2O_3$, 1 to 8% by weight of $Y_2O_3$, and 10 to 20% by weight of MgO, to which 0.1 to 5% by weight of $B_2O_3$ and/or $P_2O_5$ is added, the resultant mixture of the crystallized glass components being pulverized, fritted, and shaped, after which it is fired again to be crystallized; (4) the one as disclosed in Japanese Patent Kokai Publication No. 59-64545, which is a glass/ceramic composite material obtained by dispersing 5 to 60% (preferably 10 to 50%) by volume of ceramic particles (such as $Al_2O_3$, BN, $Si_3N_4$ or a mixture thereof having a particle size of a few microns or less), coated with $SiO_2$ thin film (e.g., a few tens to a few hundreds angstroms), in the crystallized glass having a thermal expansion coefficient of 5 to $45 \times 10^{-7}$. Either of these crystallized glass materials has its percentage of water absorption of substantially zero, a thermal expansion coefficient (from room temperature to 400° C.) of from 15 to $35 \times 10^{-7}$, and a dielectric constant of 5.5 or so (at 1 MHz). Therefore either of these insulating layers formed substantially of such crystallized glasses, when used for the purpose of the present invention, indicates a thermal expansion coefficient which is very close to that of the heat-resistant substrate.

The crystallized glass of the $ZnO—MgO—Al_2O_3—SiO_2$ system such as disclosed in JP Kokai No. 59-92943 is advantageous in that it is converted to glass-ceramics having a major crystallites phase of cordierite (2 MgO—2 $Al_2O_3$—5 $SiO_2$) precipitated through the heating for metallization (or consolidation). The cordierite-based glass-ceramics has a low dielectric constant, a low coefficient of thermal expansion, a high compatibility with silicon chips, a high resistance to thermal shock, and a low density or the like.

The paste is heated (fired) at 1,100° C. or less, preferably at a temperature of about 900° to about 1,000° C. for about 2 hours (more preferably, at about 950° to about 1,000° C. for about 1.5 hours) for metallization (consolidation) and crystallization.

The electro-conductive layer is formed of a conductor component(s) and a small amount (1-5 parts by weight) of binder which is one of the crystallized glasses hereinabove mentioned as the insulating layer material. The paste for the conductive layer is usually comprised of conductor component (Au, Cu, Cu-Au alloy, Ni, Ni-Au alloy, Ni-Cu alloy, Pt-Cu alloy, Pt-Au alloy, Pd, Pd-Cu alloy, Pd-Au alloy, Pd-Pt alloy or the like metal which has a coefficient of thermal expansion similar to the substrate can be metallized at the heating temperature of the crystallized glass paste, preferably from about 900° to about 1,000° C. Presence of a large amount of Ag is not preferred in the view of inhibiting migration. A preferred paste for the conductive layer is comprised of, by weight, 100 parts conductor component (Au etc.), 2-5 parts glass, 0.1-1 parts CuO, and 0-3 parts Ag. Below 2 parts glass, bonding strength would be insufficient, while above 5 parts glass the electric resistance becomes excessively high. Above 1 parts CuO, metallization of Au is inhibited while below 0.1 parts bonding strength is insufficient. Ag serves to promote metallization, while above 3 parts Ag migration occurs. Note, however, for the paste to be employed in certain conductive layer sandwiched between two insulating layers, the glass component may be eliminated since the glass component can be supplied from the neighboring insulating layers.

The most preferred electrically conductive paste includes, for example, one consisting of 100 parts by weight of Au paste (a product of Electro Materials Corporation of America, sold under a trade name of "EMCA 213U"); 2 to 5 parts by weight of the above-mentioned crystallized glass; 0.5 part by weight of CuO powder; and up to 3 parts by weight of Ag powder indicates its adhesive strength of 3 to 5 kg/mm$^2$, when fired at a temperature of from 900° C. to 1,000° C. It has also a small coefficient of thermal expansion and a large adhesive force of 3 to 5 kg/2 mm square same as those of the abovementioned insulating paste.

The thickness of the electrically conductive layer is selected so as to give sufficient conductivity in the resultant layer, e.g., generally about 5 to about 40 $\mu$m, preferably about 10 to about 20 $\mu$m at the metallized state. This layer thickness should be as thin as possible so long as the conductivity and production yield permit.

The following Table shows certain preferred combination of the Au paste for the conductive layers.

|  | Conductive layer paste (parts by weight) | | |
| --- | --- | --- | --- |
|  | (Inner layer) | (Outer layer) | (Outer layer) |
| Au paste (EMCA 213 U) | 100 | 100 | 100 |
| glass | 0 | 2 | 5 |
| CuO | 0.1 | 0.5 | 1 |
| Ag | 0.5 | 1 | 3 |

Minor amount of RuO$_2$, etc. may be incorporated in order to adjust the resisivity.

In the case where electro-conductive substrate such as Cu/W is employed, its surface is oxidized, then an insulating glass paste is applied to form an insulating layer on which a conductive layer and an insulating layer are formed alternately (A multilayer circuit board results by repeating the layer formation).

According to the present invention, therefore, the substrate, the insulating paste, and the conductive paste are very close in their coefficient of thermal expansion, and an oxidized layer is formed between the substrate and the conductive layer (paste) which is initially printed on it, whereby very firm adhesion can be attained to prevent cracks and peeling from taking place.

With a view to enabling those persons skilled in the art to put the present invention into practice, the following preferred embodiment is presented.

EXAMPLE

As a representative high heat-conductive substrate, there was fabricated a multilayered circuit board based on AlN substrate in the following procedures.

(1) An AlN substrate was subjected to surface treatment in a humidified reducing atmosphere at a temperature of 1,320° C. and a dew point of −15° C., thereby forming an oxidized film of about 1 $\mu$m in thickness.

(2) Subsequently, electrically conductive paste of the following composition was printed in a thick film on the surface-treated substrate through a screen, followed by heating the printed conductive paste at a temperature from 900° C. to 1,000° C. to metallize it to form a conductive layer of about 10 $\mu$m (sintered thickness). The adhesive strength of this printed film was found to be 3 to 5 kg/mm$^2$.

| Au paste (a product of Electro Materials Corporation of America, sold under a trade name of "EMCA 213 U") | 100 parts by wt. |
| --- | --- |
| crystallized glass* | 2-5 parts by wt. |
| CuO powder | 0.5 parts by wt. |
| Ag powder | 0-3 parts by wt. |

*The crystallized glass (fritt) was prepared as follows.

A mixture of ZnO, MgCO$_3$, Al(OH)$_3$, SiO$_2$, H$_3$BO$_3$ and H$_3$PO$_4$ was weighed and mixed so as to make up an oxide composition, by weight %, of 4% ZnO, 13% MgO, 23% Al$_2$O$_3$, 58% SiO$_2$, 1% B$_2$O$_3$ and 1% P$_2$O$_5$ (total 100%). The mixture was melted at 1,450° C. in an alumina crucible followed by quenching in water to form a particulated glass which was further pulverized into a fritt of an average particle size of 2 $\mu$m.

(3) Thereafter, an insulating paste was prepared from crystallized glass, which was then printed in a thick film on the abovementioned printed conductive paste, followed by heating the same at a temperature of from 900° C. to 1,000° C. to thereby form an insulating layer of about 30 $\mu$m (sintered thickness). Since this insulating layer is composed of crystallized glass of the same quality as that used in the abovementioned printed conductive layer (Au metallized layer), both layers could be rigidly joined by heating.

(4) After completion of the above film-forming procedures, the formation of the Au metallized layer and the insulating layer at the abovementioned steps (2) and (3) respectively was repeated for the required number of times, (up to 7 times) whereby the multilayered circuit board (up to 7 conductive layers) was obtained.

Incidentally, it should be noted that similar results can be obtained even when use is made of high heat-conductive substrate made of SiC, SiC/BeO, BeO, Cu/W or ZrB$_2$ in place of the abovementioned AlN.

It should also be noted that the oxidized layer can be easily formed on the substrates by their surface treatment in the humidified reducing atmosphere at a temperature of 1,200° to 1,450° C. and a dew point of −30° to +15° C. The oxidized layer may be up to a few microns while an excessively thick (e.g., above 7 microns) oxidized layer would cause cracks and peeling off due to the difference in the coefficient of expansion from that of the substrate. At least 0.01 $\mu$m is preferred and 0.1 $\mu$m would be sufficient to provide good adhesion between the glass and the substrate, while this thickness may be as thin as possible so far as the adhesion effect is sufficient.

The single FIG. 1 of the accompanying drawing is a cross-sectional view showing one embodiment of a thick film, multilayered circuit board according to the present invention, in which the metallized layer 2 is formed on both upper and lower surfaces of the high heat-conductive substrate 1, and the crystallized glass layer 3 and the metallized layer 2 are alternately printed and heated. By the way, it should be understood that the oxidized layer is formed between the substrate 1 and the crystallized glass layer 3, although it is not shown in the drawing. A reference numeral 4 designates a heat radiating fins provided on the metallized layer 2 formed on the lower surface of the substrate 1.

While, in the foregoing, the present invention has been described with particular reference to the preferred embodiment thereof, it should be understood that the invention is not limited to this embodiment alone, but any changes and modifications may be made by those persons skilled in the art within the ambit of the invention as recited in the appended claims.

What is claimed is:

1. A high heat-conductive, thick film multilayered circuit board comprising:
   a substrate having high heat conductivity selected from the group consisting of AlN, SiC/BeO, SiC, $ZrB_2$, and Cu/W having a heat conductivity of at least 40 W/m·K at room temperature;
   an oxidized layer formed on a surface of said substrate;
   an electrically conductive layer formed of a printed paste containing crystallized glass; and
   an insulating layer formed of a printed insulating paste comprised of crystallized glass as a principal constituent,
   wherein at least one of said conductive layer and at least one of said insulating layer are alternately disposed by printing on the oxidized layer of said substrate, and said conductive and insulating layers have been heated to form solid layers.

2. The circuit board as set forth in claim 1, wherein said substrate is AlN.

3. The circuit board as set forth in claim 1, wherein said crystallized glass has a coefficient of thermal expansion of 1.5 to $4.5 \times 10^{-6}$/°C. at a temperature range between room temperature and 400° C.

4. The circuit board as set forth in claim 3, wherein said crystallized glass has a coefficient of thermal expansion of 2.5 to $4.5 \times 10^{-6}$/°C.

5. The circuit board as set forth in claim 3, wherein said crystallized glass has a heating temperature for consolidation from a paste thereof at a temperature of 1,100° C. or less.

6. The circuit board as set forth in claim 5, wherein said crystallized glass has said heating temperature for consolidation between about 900° C. and about 1,000° C.

7. The circuit board as set forth in claim 1, wherein said electrically conductive layer comprises an electrically conductive metal component which can be metallized at a heating temperature for consolidation of the crystallized glass.

8. The circuit board as set forth in claim 7, wherein said metal component is one or more selected from the group consisting of Au, Cu, Cu-Au alloy, Ni, Ni-Au alloy, Ni-Cu alloy, Pt-Cu alloy, Pt-Au alloy, Pd, Pd-Cu alloy, Pd-Au alloy and Pd-Pt alloy.

9. The circuit board as set forth in claim 7, wherein said electrically conductive layer comprises 1 to 5 parts by weight of the crystallized glass per 100 parts of Au.

10. The circuit board as set forth in claim 9, wherein said electrically conductive layer further comprises 0.1 to 1 parts by weight of CuO and up to 3 parts by weight of Ag, respectively, per 100 parts by weight of said metal component.

11. The circuit board as set forth in claim 1, wherein said thick film conductive paste is consisting essentially of: 100 parts by weight of Au, 2 to 5 parts by weight fo crystallized glass having a coefficient of thermal expansion of 2.5 to $4.5 \times 10^{-6}$/°C. between room temperature and 400° C., 0.1 to 1 part by weight of copper oxide (CuO) powder, and 3 parts by weight or less of Ag powder.

12. The circuit board as set forth in claim 1, wherein said insulating paste consists essentially of crystallized glass having a coefficient of thermal expansion of 2.5 to $4.5 \times 10^{-6}$/°C.

13. A high heat-conductive, thick film multilayered circuit board comprising:
   a substrate having high heat conductivity selected from the group consisting of AlN, SiC/BeO, SiC, $ZrB_2$ and Cu/W having a heat conductivity of at least 40 W/m·K at room temperature;
   an oxidized layer formed on a surface of said substrate by surface treatment of said substrate in a humidified reducing atmosphere at a temperature of from 1,000° C. to 1,500° C.;
   an electrically conductive layer formed of a printed paste containing crystallized glass; and
   an insulating layer formed of a printed insulating paste;
   wherein at least one of said conductive layer and at least one of said insulating layer are alternately disposed by printing on the oxidized layer of said substrate, and said conductive and insulating layers have been heated to form solid layers.

14. The circuit board as set forth in claim 13, wherein said oxidized layer has been formed by surface treatment of said substrate in a humidified reducing atmosphere with a dew point of −30° to +15° C.

15. The circuit board as set forth in claim 13, wherein said substrate is AlN having a dielectric constant of about 5.5 (at 1 MHz).

16. The circuit board as set forth in claim 1, wherein said substrate has a dielectric constant of about 5.5 (at 1 MHz).

17. The circuit board as set forth in claim 1, wherein said crystallized glass has a water absorbance of nearly zero.

18. The circuit board as set forth in claim 17, wherein said crystallized glass has a coefficient of thermal expansion of 1.5 to $3.5 \times 10^{-6}$/°C. between room temperature and 400° C.

19. The circuit board as set forth in claim 18, wherein said crystallized glass is selected from the group generally expressed by a formula $RO-Al_2O_3-SiO_2$ where RO represents ZnO, MgO, $Li_2O$, $Y_2O_3$, $ZrO_2$, CaO, BaO, $B_2O_3$ or $P_2O_5$.

20. The circuit board as set forth in claim 19, wherein said crystallized glass is selected from the group consisting of $ZnO-MgO-Al_2O_3-SiO_2$, $CaO-B_2O_3-MgO-Al_2O_3-SiO_2$, $Y_2O_3-MgO-Al_2O_3-SiO_2$, $Li_2O-Al_2O_3-SiO_2$ and $BaO-Al_2O_3-SiO_2$.

21. The circuit board as set forth in claim 19, wherein said crystallized glass is composed of, by weight, 57–63% $SiO_2$, 20–28% $Al_2O_3$, 10–18% MgO, 2–6% ZnO, and 0.1–6% of at least one of $B_2O_3$ and $P_2O_5$.

22. The circuit board as set forth in claim 19, wherein said crystallized glass is composed of, by weight, 40–52% $SiO_2$, 27–37% $Al_2O_3$, 10–20% MgO, 2–8% $B_2O_3$, 2–8% CaO, and 0.1–3% $ZrO_2$.

23. The circuit board as set forth in claim 19, wherein said crystallized glass is composed of, by weight, 55-63% $SiO_2$, 20-28% $Al_2O_3$, 1-8% $Y_2O_3$, 10-20% MgO and 0.1-5% of at least one of $B_2O_3$ and $P_2O_5$.

24. The circuit board as set forth in claim 19, wherein said crystallized glass is of a $ZnO-MgO-Al_2O_3-SiO_2$ system and, when crystallized, has a major crystallites phase of cordierite.

25. The circuit board as set forth in claim 19, wherein said crystallized glass contains up to 60% by volume of fine ceramic particles coated with a thin $SiO_2$ film.

26. The circuit board as set forth in claim 25, wherein said ceramic particles are selected from the group consisting of $Al_2O_3$, Bn and $Si_3N_4$.

27. The circuit board as set forth in claim 1, wherein each of said electrically conductive layer and insulating layer has been heated for metallization or consolidation to form either one of said layers each after a respective paste has been applied.

28. The circuit board as set forth in claim 1, wherein said oxidized layer has a thickness of up to about a few microns.

29. The circuit board as set forth in claim 1, wherein said oxidized layers has a thickness of at least 0.1 microns.

30. The circuit board as set forth in claim 28, wherein said oxidized layer has a thickness of about one microns.

31. The circuit board as set forth in claim 1, wherein said substrate is electrically insulating material and the electrically conductive layer is first applied onto said oxidized layer.

32. The circuit board as set forth in claim 1, wherein said substrate is electrically conductive and the insulating layer is first applied onto said oxidized layer.

33. The circuit board as set forth in claim 32, wherein said substrate is Cu/W.

34. The circuit board as set forth in claim 1, wherein said electrically conductive layer and the insulating layer are alternately laminated to form a multilayer circuit board comprising at least several circuit layers formed of said electrically conductive layer.

35. The circuit board as set forth in claim 34, wherein one of said electrically conductive layers is formed of a conductor paste containing no crystallized glass when this conductive layer is disposed between two insulating layers.

36. The circuit board as set forth in claim 1, wherein said electrically conductive layer has a thickness of about 5 to about 40 $\mu$m.

37. The circuit board as set forth in claim 36, wherein said electrically conductive layer has a thickness of about 10 to about 20 $\mu$m.

38. The circuit board as set forth in claim 1, wherein said insulating layer has a thickness of about 10 to about 250 $\mu$m.

39. The circuit board as set forth in claim 38, wherein said insulating layer has a thickness of about 30 $\mu$m.

* * * * *